US008664759B2

(12) United States Patent
Ryan

(10) Patent No.: US 8,664,759 B2
(45) Date of Patent: Mar. 4, 2014

(54) INTEGRATED CIRCUIT WITH HEAT CONDUCTING STRUCTURES FOR LOCALIZED THERMAL CONTROL

(75) Inventor: Vivian Ryan, Hampton, NJ (US)

(73) Assignee: Agere Systems LLC, Allentown, PA (US)

(*) Notice: Subject to any disclaimer, the term of this patent is extended or adjusted under 35 U.S.C. 154(b) by 1450 days.

(21) Appl. No.: 11/158,370

(22) Filed: Jun. 22, 2005

(65) Prior Publication Data
US 2006/0289988 A1    Dec. 28, 2006

(51) Int. Cl.
*H01L 23/34*    (2006.01)
*H01L 23/12*    (2006.01)
*H01L 23/053*   (2006.01)
*H01L 23/48*    (2006.01)
*H01L 23/52*    (2006.01)
*H01L 29/40*    (2006.01)
*H01L 21/00*    (2006.01)
*H01L 21/20*    (2006.01)
*H01L 21/44*    (2006.01)
*H01L 21/4763*  (2006.01)

(52) U.S. Cl.
USPC ........... 257/713; 257/701; 257/702; 257/717; 257/758; 257/762; 257/778; 257/E23.08; 257/E23.109; 257/E23.11; 438/106; 438/584; 438/598; 438/599; 438/622; 438/637; 438/638; 438/687; 438/688

(58) Field of Classification Search
None
See application file for complete search history.

(56) References Cited

U.S. PATENT DOCUMENTS

| | | | | |
|---|---|---|---|---|
| 5,621,616 A * | 4/1997 | Owens et al. | ............... | 361/704 |
| 5,955,781 A * | 9/1999 | Joshi et al. | ............... | 257/712 |
| 6,046,503 A | 4/2000 | Weigand et al. | ............... | 257/758 |
| 6,100,199 A | 8/2000 | Joshi et al. | ............... | 438/694 |
| 6,121,659 A * | 9/2000 | Christensen et al. | ............... | 257/347 |
| 6,242,807 B1 * | 6/2001 | Kazami | ............... | 257/758 |
| 6,525,419 B1 * | 2/2003 | Deeter et al. | ............... | 257/712 |
| 6,646,340 B2 * | 11/2003 | Deeter et al. | ............... | 257/712 |
| 6,710,443 B1 * | 3/2004 | Rost et al. | ............... | 257/712 |

OTHER PUBLICATIONS

Flipchips.com. Solder Bump Flip Chip. Nov. 2000. Flipchips.com. pp. 1-6.*
U.S. Appl. No. 10/879,909, filed Jun. 29, 2004, V. Ryan et al.

* cited by examiner

*Primary Examiner* — Hoang-Quan Ho
(74) *Attorney, Agent, or Firm* — Ryan, Mason & Lewis, LLP

(57) ABSTRACT

An integrated circuit die includes a substrate having an upper surface, at least one active device formed in a first area of the upper surface of the substrate, and a plurality of layers formed on the upper surface of the substrate above the at least one active device. A first stacked heat conducting structure is provided, spanning from a point proximate the first area of the upper surface of the substrate through the plurality of layers. A lateral heat conducting structure is formed above the uppermost layer of the plurality of layers and in thermal contact with the first stacked heat conducting structure. The invention advantageously facilitates the dissipation of heat from the integrated circuit die, particularly from high-power sources or other localized hot spots.

21 Claims, 3 Drawing Sheets

INTEGRATED CIRCUIT WITH HEAT CONDUCTING STRUCTURES FOR LOCALIZED THERMAL CONTROL

FIELD OF THE INVENTION

This invention relates generally to integrated circuits, and more specifically to techniques for controlling heat dissipation in integrated circuits.

BACKGROUND OF THE INVENTION

With advances in semiconductor design and fabrication, the circuit density that can be implemented on a given integrated circuit die has steadily increased, leading to higher power consumption and heat generation. Simultaneously, the scaling to finer geometries has exacerbated issues such as sub-threshold leakage current, making the circuits more susceptible to performance degradation due to temperature variations across the die. Thus, it is becoming increasingly important to efficiently remove heat from an integrated circuit die in order to avoid temperature induced failures.

A typical approach to removing heat from an integrated circuit die is to attach a heat sink to the exterior of the semiconductor packaging. A heat sink is commonly understood to increase the dissipation of heat by means of conduction, convection and radiation as a result of the heat sink's high thermal conductivity and relatively large mass and surface area. The package itself is relied upon to provide the thermal pathway from the integrated circuit die to the external heat sink. In a typical embodiment, a die attach material adheres the backside of the integrated circuit die to the package baseplate which may be a leadframe or a plastic or ceramic substrate. The type of material used for the die attach is a function of the package type and performance requirements. Typical materials are epoxy, lead-tin solder and gold alloys.

Unfortunately, such a configuration may result in device reliability failures and other problems. Heat dissipation with this configuration may simply be inadequate for higher power devices. In addition, voids and poor coverage by the die attach layer, as well as inherent local high-power sources in the integrated circuit channel layer, may cause large temperature gradients across the integrated circuit die. These gradients may cause regions of the die to be outside of the optimal operating temperature range, and may also cause mechanical stresses due to non-uniform thermal expansion.

Improved heat dissipation techniques which alleviate or overcome the above-identified problems are disclosed in U.S. patent application Ser. No. 10/879,909, filed Jun. 29, 2004 and entitled "Heat Sink Formed of Multiple Metal Layers on Backside of Integrated Circuit Die," which is incorporated by reference herein. In one illustrative arrangement, an integrated circuit die includes a substrate having a front surface and a back surface, with the substrate front surface having electrical circuits formed thereon, and the substrate back surface having a plurality of metal layers formed thereon. The plurality of metal layers comprises at least one layer having a thickness of greater than about ten micrometers. The outermost metal layer may be mechanically and thermally bonded to a package using a die attach layer comprising a thermally conductive reflowable material. The metal layers are configured such that delamination, fracturing and metal diffusion into the substrate are avoided, while heat dissipation is increased.

Despite the considerable advances provided by the techniques disclosed in the above-cited U.S. patent application Ser. No. 10/879,909, a need remains for further improvements, particularly in terms of localized heat removal from high-power sources or "hot spots" on an integrated circuit die.

A number of prior art approaches address this localized heat removal issue through the use of heat transfer structures which are arranged within the integrated circuit die itself. These include U.S. Pat. No. 5,621,616 to Owens et al., entitled "High Density CMOS Integrated Circuit with Heat Transfer Structure for Improved Cooling," U.S. Pat. No. 6,046,503 to Weigand et al., entitled "Metalization System Having an Enhanced Thermal Conductivity," and U.S. Pat. No. 6,100,199 to Joshi et al., entitled "Embedded Thermal Conductors for Semiconductor Chips," all of which are incorporated by reference herein.

However, these conventional approaches fail to provide an adequate solution to the problem of localized heat removal from high-power sources or other hot spots on an integrated circuit die. A need therefore exists for improved heat dissipation techniques for use in integrated circuits.

SUMMARY OF THE INVENTION

The present invention addresses the above-identified need by providing techniques for enhanced heat dissipation in an integrated circuit. The techniques in a number of illustrative embodiments are particularly well suited for localized thermal control of hot spots on the substrate of an integrated circuit die.

In accordance with one aspect of the invention, an integrated circuit die includes a substrate having an upper surface, at least one active device formed in a first area of the upper surface of the substrate, and a plurality of layers formed on the upper surface of the substrate above the at least one active device. A first stacked heat conducting structure is provided, spanning from a point proximate the first area of the upper surface of the substrate through the plurality of layers. A lateral heat conducting structure is formed above the uppermost layer of the plurality of layers and in thermal contact with the first stacked heat conducting structure.

The integrated circuit die may further comprise a second stacked heat conducting structure in thermal contact with the lateral heat conducting structure and spanning from a point proximate a second area of the upper surface of the substrate through the plurality of layers, with the second area of the substrate being laterally removed from the first area of the substrate. In such an arrangement, heat is conducted from the first area to the second area via the first stacked heat conducting structure, the lateral heat conducting structure, and the second stacked heat conducting structure. For example, the first area may comprise a heat source of the integrated circuit die and the second area may comprise a cooler area of the substrate, relative to the first area, with heat being removable from the second area via a back surface of the substrate.

A given one of the stacked heat conducting structures may comprise an interconnected arrangement of one or more metal trenches formed in respective ones of the layers and one or more metal vias passing through respective ones of the layers.

The lateral heat conducting structure may be formed above a passivation layer of the integrated circuit die, where the passivation layer comprises the uppermost layer of the plurality of layers. Additionally or alternatively, the lateral heat conducting structure may be formed in an under bond metallization layer of the integrated circuit die, with the under bond metallization layer being formed over the plurality of layers.

Advantageously, the illustrative embodiments provide substantially improved thermal control of hot spots on an integrated circuit substrate. Moreover, the present invention in one or more of the illustrative embodiments can be readily implemented utilizing processing steps of a type commonly available in integrated circuit manufacturing, and thus without significant additional cost or complexity.

These and other features and advantages of the present invention will become apparent from the following detailed description which is to be read in conjunction with the accompanying drawings.

DETAILED DESCRIPTION OF THE INVENTION

The present invention will be illustrated herein in the context of exemplary integrated circuit arrangements comprising heat conducting structures. It is to be appreciated that the particular circuit arrangements and associated heat conducting structures shown in the illustrative embodiments are presented by way of example only. Accordingly, the invention should not be construed as requiring any particular aspects of these exemplary elements.

The term "integrated circuit die" as used herein may comprise any type of device wherein electrical circuits are fabricated in or on a semiconductor substrate. A given integrated circuit die may be of any type including analog, digital or mixed signal. Furthermore, a given die may comprise electrical circuits of any type, configuration and dimension.

The term "substrate" comprises any type of crystalline semiconductor material and is not limited to that formed of silicon. Optionally, other materials may be used such as gallium arsenide and indium phosphide. Additionally, a substrate may comprise one or more materials in addition to a semiconductor material. For instance, a substrate as defined herein would encompass Silicon-on-Insulator (SOI) wafers which comprise both crystalline silicon and silicon dioxide.

The term "package" as used herein comprises any type of structural arrangement used to facilitate electrical connection to the integrated circuit die while providing mechanical and environmental protection for the die.

Figure 1A:
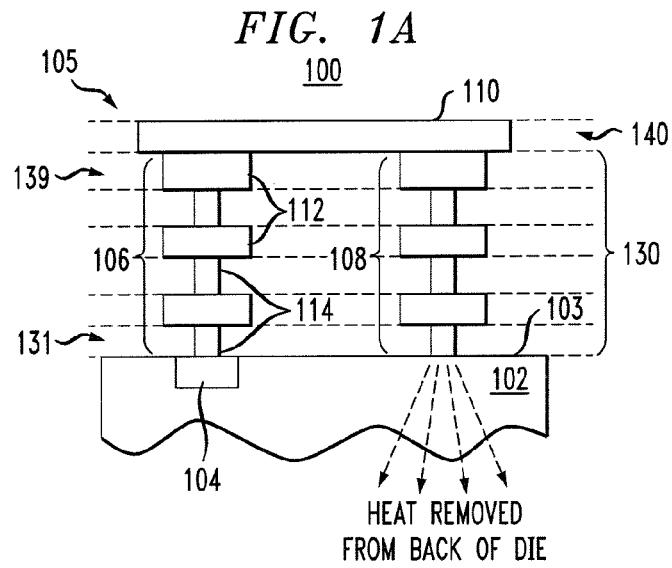
FIGS. 1A, 2A and 3A show side sectional views of respective portions of integrated circuits in illustrative embodiments of the invention.

Referring now to FIG. 1A, an integrated circuit die 100 comprises a substrate 102 having an upper surface 103. Formed in a first area of the upper surface 103 of the substrate 102 is a heat source 104, which will typically comprise at least one transistor or other active device formed in the first area of the upper surface of the substrate. The die 100 further comprises a set of interconnected heat conducting structures 105, which in this example includes a first stacked heat conducting structure 106, a second stacked heat conducting structure 108, and a lateral heat conducting structure 110. The heat conducting structures are coupled together or otherwise in thermal contact with one another so as to effect the removal of heat from a localized hot spot on substrate 102, in this case the heat source 104, to a cooler area of the substrate.

The die 100 includes a plurality of layers 130 formed on the upper surface 103 of the substrate 102 above the heat source 104. Associated with and formed in these layers are trenches 112 and vias 114. Generally, each such element may be associated with a corresponding one of the plurality of layers formed on the upper surface 103 of substrate 102. Alternatively, a pair of elements, such as one of the trenches 112 and an adjacent one of the vias 114, may be associated with a single layer of the plurality of layers. The invention does not require any particular arrangement of layers, and such layers may comprise, for example, one or more metallization layers, oxide or other insulating layers, or other types of layers, in any combination. The trenches and vias are formed within the layers in this embodiment. Thus, certain boundaries of the layers are illustrated by these trenches and vias, although other portions of the layers are omitted from the figures for simplicity and clarity of illustration. Those skilled in the art will recognize that such trenches and vias may be formed in a plurality of layers using well-known integrated circuit manufacturing techniques.

As shown, the first stacked heat conducting structure 106 comprises an interconnected arrangement of one or more metal trenches 112 formed in respective ones of the layers and one or more metal vias 114 passing through respective ones of the layers. In this example, the first stacked heat conducting structure 106 more particularly comprises as an initial element thereof a first via 114, followed by a first trench 112, with alternating vias and trenches thereafter until the top of the first stacked heat conducting structure 106 is reached. The first via 114 of structure 106 may be embedded in an otherwise conventional oxide layer 131 overlying one or more active devices of the heat source 104. It is to be understood, however, that this particular stacked arrangement of alternating vias and trenches is not required, but can instead be replaced with other stacked elements in any arrangement suitable for providing the desired heat conducting functionality. The term "stacked" as used herein is therefore intended to be construed generally, so as to encompass, for example, two or more elements at least partially formed on top of one another so as to implement a heat conducting structure.

The first stacked heat conducting structure 106 spans from a point proximate an area of the substrate containing the heat source 104 through the plurality of layers in which trenches 112 and vias 114 are formed. The lateral heat conducting structure 110 is formed above the uppermost layer 139 of the plurality of layers 130 and is in thermal contact, by direct coupling in this example, with the first stacked heat conducting structure 106.

The second stacked heat conducting structure 108 is in thermal contact with the lateral heat conducting structure 110, again by direct coupling in this example, and spans from a point proximate a second area of the upper surface 103 of the substrate 102 through the plurality of layers 130. The second area of the upper surface of the substrate is laterally removed from the area of the substrate upper surface containing heat source 104. The second stacked heat conducting structure 108 is formed in a manner similar to the first such structure 106, namely, by an interconnected arrangement of alternating vias 114 and trenches 112 as shown. As in structure 106, the first via 114 of structure 108 in this embodiment may be embedded in an otherwise conventional oxide layer 131 overlying the second area.

In operation, heat is conducted in die 100 from the area of the upper surface of the substrate containing the heat source 104 to the second area of the upper surface of the substrate via the first stacked heat conducting structure 106, the lateral heat conducting structure 110, and the second stacked heat conducting structure 108. Typically, the second area comprises an area of the upper surface of the substrate that is cooler than the area which contains the heat source. Heat may be readily removable from the second area, for example, via a back surface of the substrate, as indicated by the arrows in FIG. 1A. Thus, this embodiment advantageously provides localized temperature control of the integrated circuit die hot spot associated with heat source 104.

In the illustrative embodiments, a given one of the stacked heat conducting structures 106, 108 may comprise one or more metal structures formed at least in part from copper, and the lateral heat conducting structure 110 may comprise one or more metal structure formed at least in part from aluminum, although additional or alternative materials can be used. Generally, materials providing a high thermal conductivity are preferred.

A given such metal structure may comprise at least a portion of an otherwise conventional metallization layer or other metal layer of the integrated circuit die. Thus, such structures may be formed using a variety of well-known conventional techniques used to form interconnects and other elements typically found in an integrated circuit die. See, e.g., S. Wolf and R. N. Tauber, Silicon Processing for the VLSI Era, Volume 1 (1986), S. M. Sze, VLSI Technology (2d ed. 1988), and R. F. Bunshah, Handbook of Deposition Technologies for Films and Coatings, Science and Technology Applications (2d ed. 1994), which are incorporated by reference herein. As these and other techniques suitable for forming integrated circuit elements are well understood by those skilled in the art, they will not be described in detail herein.

Figure 1B:
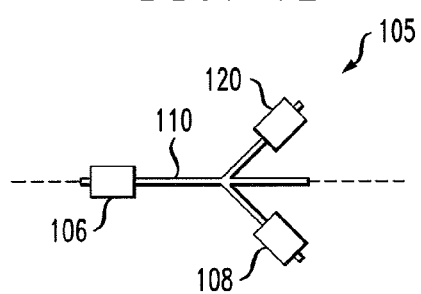
FIGS. 1B, 2B and 3B show top views of heat conduction structures of the integrated circuits of FIGS. 1A, 2A and 3A, respectively.

FIG. 1B shows a top view of one possible configuration of the set of heat conducting structures 105 of FIG. 1A. In this arrangement, the set 105 comprises the first and second stacked heat conducting structures 106, 108 and the lateral heat conducting structure 110. In addition, the set 105 comprises a third stacked heat conducting structure 120 in thermal contact with the lateral heat conducting structure 110. Although not explicitly shown as such in FIG. 1B, the third stacked heat conducting structure 120 may be formed in a manner similar to structures 106, 108, and may span from a point proximate a third area of the upper surface 103 of the substrate 102 through the plurality of layers. The third area of the substrate may be laterally removed from the first and second areas of the substrate, with heat being conducted from the first area to the third area via the first stacked heat conducting structure 106, the lateral heat conducting structure 110, and the third stacked heat conducting structure 120.

As is apparent from the top view of FIG. 1B, the lateral heat conducting structure 110 comprises a plurality of branches, the branches being coupled at respective ends thereof to respective ones of the stacked heat conducting structures 106, 108 and 120. Typically, the lateral heat conducting structure 110 is formed above the plurality of layers 130 in which the trenches 112 and vias 114 of the stacked heat conducting structures are formed. For example, the lateral heat conducting structure 110 may be formed above an otherwise conventional passivation layer 139 of the integrated circuit die 100, the passivation layer comprising an uppermost layer of the plurality of layers in which trenches 112 and vias 114 are formed. Additionally or alternatively, the lateral heat conducting structure 110 may be formed in an under bond metallization (UBM) layer 140 of the integrated circuit die 100, with the UBM layer being formed over the plurality of layers in which the trenches 112 and vias 114 are formed. The term "UBM" in this context is intended to cover arrangements involving either wire bonds, solder balls, or both.

Figure 2A:
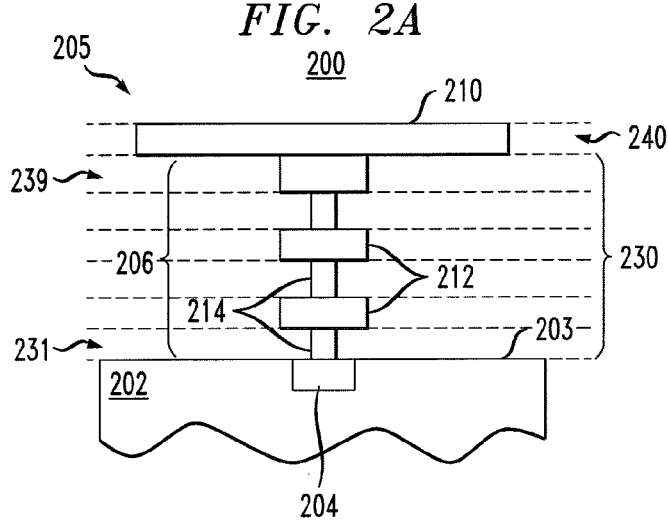

FIG. 2A shows an integrated circuit die 200 comprising a substrate 202 having an upper surface 203. Formed in a first area of the upper surface 203 of the substrate 202 is a heat source 204, which will typically comprise at least one transistor or other active device formed in the first area of the upper surface of the substrate. The die 200 further comprises a set of interconnected heat conducting structures 205, which in this example includes a first stacked heat conducting structure 206 and a lateral heat conducting structure 210. The heat conducting structures 206, 210 are coupled together or otherwise in thermal contact with one another so as to effect the removal of heat from a localized hot spot on substrate 202, namely, heat source 204.

The die 200 includes a plurality of layers 230 formed on the upper surface 203 of the substrate 202 above the heat source 204. Associated with these layers are trenches 212 and vias 214. Generally, each such element may be associated with a corresponding one of the plurality of layers formed on the upper surface 203 of substrate 202. Alternatively, a pair of elements, such as one of the trenches 212 and an adjacent one of the vias 214, may be associated with a single layer of the plurality of layers.

The various elements of the FIG. 2A embodiment, such as layers 231, 239 and 240, are generally configured and operate in a manner similar to the corresponding elements of the FIG. 1A embodiment. However, in the FIG. 2A embodiment, the heat conducting structures do not direct the heat from the heat source 104 back to another area of the substrate surface. Instead, the heat is directed to the lateral heat conducting structure 210 from which it can be removed using convection or other conventional thermal mitigation techniques. In any case, this arrangement serves to distribute the heat from heat source 204 over the integrated circuit die 200.

Figure 2B:
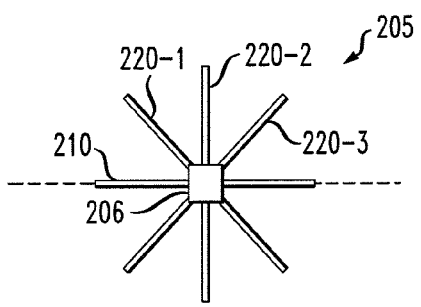

FIG. 2B shows a top view of one possible configuration of the set of heat conducting structures 205 of FIG. 2A. In this arrangement, the set 205 comprises the stacked heat conducting structure 206 and the lateral heat conducting structure 210, as well as a number of additional lateral heat conducting structures 220-1, 220-2 and 220-3 arranged as shown. Generally, this configuration may be viewed as an example of an arrangement in which a unified lateral heat conducting structure comprises a plurality of branches emanating from a central portion of the structure, with the central portion being directly coupled to or otherwise in thermal contact with the stacked heat conducting structure 206.

In other embodiments of the invention, a given stacked heat conducting structure need not be in direct contact with the localized heat source. Also, numerous alternative arrangements of stacked and lateral heat conducting structures are possible.

Figure 3A:
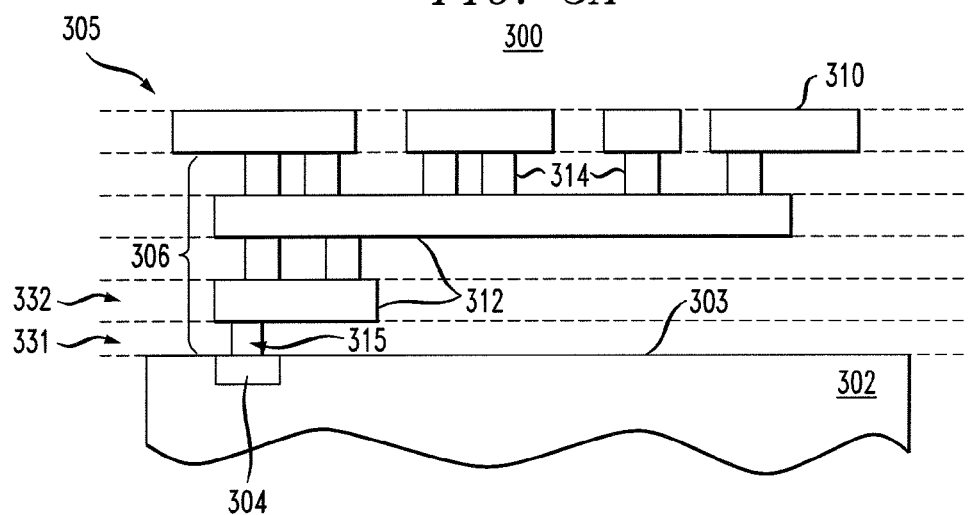

FIG. 3A shows another alternative embodiment of the invention. In this embodiment, an integrated circuit die 300 comprises a substrate 302 having an upper surface 303 with a heat source 304 formed therein. The die 300 further comprises a set of interconnected heat conducting structures 305, which in this example includes a stacked heat conducting structure 306 and a lateral heat conducting structure 310. As in the other embodiments, the stacked heat conducting structure 306 is formed of an interconnected arrangement of trenches 312 and vias 314. Furthermore, the heat conducting structures 306, 310 are coupled together or otherwise in thermal contact with one another so as to effect the removal of heat from a localized hot spot on substrate 302, namely, heat source 304.

The stacked heat conducting structure 306 comprises as an initial element thereof a first trench 312, which may be formed in a metallization layer 332 above an oxide layer 331 overlying one or more active devices of the heat source 304. Alternatively, an initial via, shown in dashed outline as element 315 in the figure, may comprise the initial element of the stacked heat conducting structure 306.

Figure 3B:
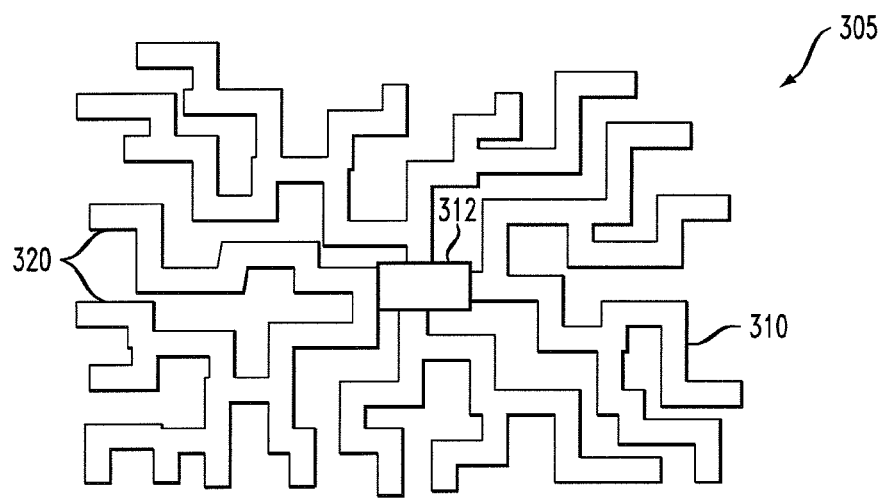

FIG. 3B shows a top view of one possible configuration of the set of heat conducting structures 305 of FIG. 3A. In this arrangement, the set 305 comprises the stacked heat conducting structure 306 and the lateral heat conducting structure 310, as well as a number of additional lateral heat conducting structures 320 arranged as shown. This configuration may be viewed as another example of an arrangement in which a unified lateral heat conducting structure comprises a plurality of branches emanating from a central portion of the structure, with the central portion being directly coupled to or otherwise in thermal contact with the stacked heat conducting structure 306. Like the FIG. 2B arrangement, the heat conducting structures 306, 310 and 320 do not direct the heat from the heat source 304 back to another area of the substrate surface. Instead, the heat is directed to the lateral heat conducting structures from which it can be removed using convection or other conventional thermal mitigation techniques. In any case, this arrangement serves to distribute the heat from heat source 304 over the integrated circuit die 300.

Figure 4:
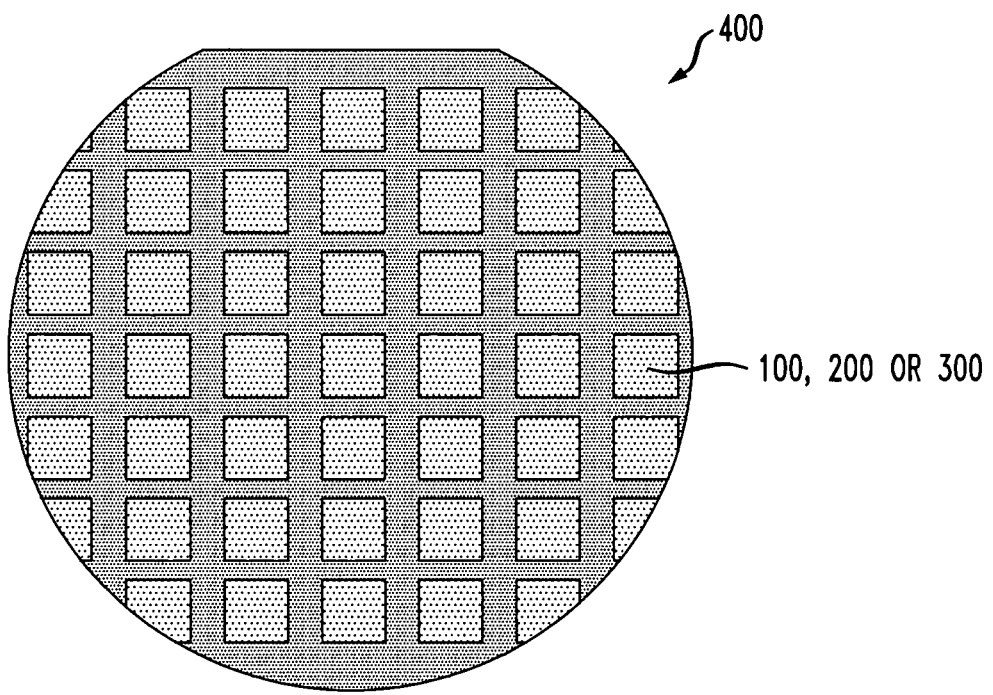
FIG. 4 shows a semiconductor wafer comprising a plurality of integrated circuits configured in accordance with the invention.

It should be noted that, in forming integrated circuit die such as those shown in FIGS. 1A, 2A and 3A, a plurality of identical die are typically formed in a repeated manner on a surface of a semiconductor wafer. FIG. 4 shows an illustrative embodiment of a semiconductor wafer 400 on which a plurality of identical die 100, 200 or 300 are formed. Each die includes a device as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Figure 5:
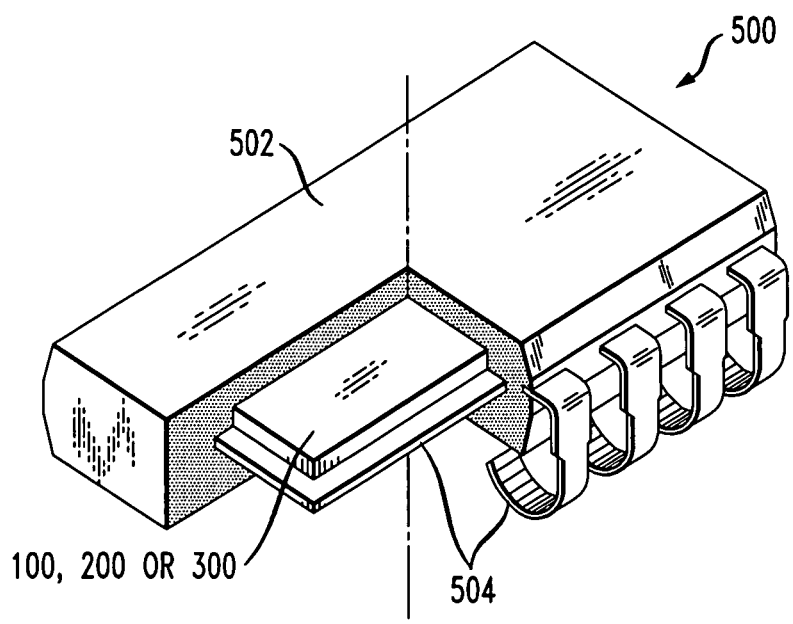
FIG. 5 shows a partial sectional view of a packaged integrated circuit die embodying features of the present invention.

The present invention can be implemented using any type of integrated circuit package, including, for example, plastic packages, ceramic packages, flip-chip package, etc. FIG. 5 shows an illustrative embodiment of a packaged integrated circuit 500 in which an integrated circuit die 100, 200 or 300 is enclosed in a plastic packaging material 502. Prior to enclosure in the packaging material 502 the die is bonded to a package attachment baseplate. In this embodiment, the attachment baseplate is a portion of a metal leadframe 504 such as that typically used in plastic leadframe-based packages. However, the integrated circuit die may be bonded to other types of baseplates depending on the type of package. For instance, in some packages, the integrated circuit die is bonded to a ceramic or plastic substrate. Again, the particular package assembly shown is not a requirement of this invention, and this and other packages suitable for use with the present invention will be familiar to those skilled in the art.

Advantageously, integrated circuits with heat conducting structures as described above may be formed utilizing processing steps of a type commonly available in integrated circuit manufacturing, and thus without significant increase in circuit cost or complexity.

It should again be emphasized that the above-described embodiments of the invention are intended to be illustrative only. No limitation with respect to the specific embodiments described herein is intended or should be inferred. Other embodiments can use different types and arrangements of elements for implementing the described functionality. For example, the shapes, configurations and manner of interconnection of the stacked and lateral heat conducting structures may be varied to accommodate the particular needs of a given application. These and numerous other alternative embodiments within the scope of the following claims will be apparent to one skilled in the art.

What is claimed is:

1. An integrated circuit die comprising:
    a substrate having an upper surface;
    at least one active device formed in a first area of the upper surface of the substrate;
    a plurality of layers formed on the upper surface of the substrate above the at least one active device;
    a first stacked heat conducting structure spanning from a point proximate the first area of the upper surface of the substrate through the plurality of layers;
    a lateral heat conducting structure formed above the uppermost layer of the plurality of layers and in thermal contact with the first stacked heat conducting structure; and
    a second stacked heat conducting structure in thermal contact with the lateral heat conducting structure and spanning from a point proximate to a second area of the upper surface of the substrate through the plurality of layers, the second area of the substrate being laterally removed from the first area of the substrate;
    wherein the first stacked heat conducting structure is electrically isolated from the active device;
    wherein the first stacked heat conducting structure is formed vertically above the active device;
    wherein an initial element of the first stacked heat conducting structure is in thermal contact with an oxide layer overlying the active device; and
    wherein heat generated in the first area by the active device is conducted by the first stacked heat conducting structure to the lateral heat conducting structure.

2. The integrated circuit die of claim 1 wherein the first stacked heat conducting structure comprises an interconnected arrangement of one or more metal trenches formed in respective ones of the plurality of layers and one or more metal vias passing through respective ones of the plurality of layers.

3. The integrated circuit die of claim 1 wherein heat is conducted from the first area to the second area via the first stacked heat conducting structure, the lateral heat conducting structure, and the second stacked heat conducting structure.

4. The integrated circuit die of claim 1 wherein the first area comprises a heat source of the integrated circuit die and the second area comprises a cooler area of the substrate relative to the first area, heat being removable from the second area via a back surface of the substrate.

5. The integrated circuit die of claim 1 further comprising a third stacked heat conducting structure in thermal contact with the lateral heat conducting structure and spanning from a point proximate a third area of the upper surface of the substrate through the plurality of layers, the third area of the substrate being laterally removed from the first and second areas of the substrate, heat being conducted from the first area to the third area via the first stacked heat conducting structure, the lateral heat conducting structure, and the third stacked heat conducting structure.

6. The integrated circuit die of claim 5 wherein the lateral heat conducting structure comprises a plurality of branches, the branches being coupled at respective ends thereof to respective ones of the stacked heat conducting structures.

7. The integrated circuit die of claim 1 wherein the lateral heat conducting structure comprises a plurality of branches emanating from a central portion of the structure, the central portion being coupled to the first stacked heat conducting structure.

8. The integrated circuit die of claim 2 wherein the first stacked heat conducting structure comprises as the initial element thereof a first via embedded in the oxide layer overlying the active device.

9. The integrated circuit die of claim 2 wherein the first stacked heat conducting structure comprises as the initial element thereof a first trench formed in a metallization layer above the oxide layer overlying the active device.

10. The integrated circuit die of claim 1 wherein the first stacked heat conducting structure comprises a metal structure formed at least in part from copper.

11. The integrated circuit die of claim 1 wherein the lateral heat conducting structure comprises a metal structure formed at least in part from aluminum.

12. A packaged integrated circuit comprising:
an integrated circuit die comprising a substrate having an upper surface; at least one active device formed in a first area of the upper surface of the substrate; a plurality of layers formed on the upper surface of the substrate above the at least one active device; a first stacked heat conducting structure spanning from a point proximate the first area of the upper surface of the substrate through the plurality of layers; a lateral heat conducting structure formed above the uppermost layer of the plurality of layers and in thermal contact with the first stacked heat conducting structure; and a second stacked heat conducting structure in thermal contact with the lateral heat conducting structure and spanning from a point proximate to a second area of the upper surface of the substrate through the plurality of layers, the second area of the substrate being laterally removed from the first area of the substrate; and
a package enclosing the integrated circuit die;
wherein the first stacked heat conducting structure is electrically isolated from the active device;
wherein the first stacked heat conducting structure is formed directly vertically above the active device;
wherein an initial element of the first stacked heat conducting structure is in thermal contact with an oxide layer overlying the active device; and
wherein heat generated in the first area by the active device is conducted by the first stacked heat conducting structure to the lateral heat conducting structure.

13. The packaged integrated circuit of claim 12 wherein the package comprises one of a plastic package, a ceramic package and a flip-chip package.

14. A method of forming an integrated circuit die comprising:
providing a substrate having an upper surface;
forming at least one active device in a first area of the upper surface of the substrate;
forming a plurality of layers on the upper surface of the substrate above the at least one active device;
providing a first stacked heat conducting structure spanning from a point proximate the first area of the upper surface of the substrate through the plurality of layers;
forming a lateral heat conducting structure above the uppermost layer of the plurality of layers and in thermal contact with the first stacked heat conducting structure; and
providing a second stacked heat conducting structure in thermal contact with the lateral heat conducting structure and spanning from a point proximate to a second area of the upper surface of the substrate through the plurality of layers, the second area of the substrate being laterally removed from the first area of the substrate;
wherein the first stacked heat conducting structure is electrically isolated from the active device;
wherein the first stacked heat conducting structure is formed vertically above the active device;
wherein an initial element of the first stacked heat conducting structure is in thermal contact with an oxide layer overlying the active device; and
wherein heat generated in the first area by the active device is conducted by the first stacked heat conducting structure to the lateral heat conducting structure.

15. The method of claim 14 further comprising the step of enclosing the integrated circuit die in a package to form a packaged integrated circuit.

16. The method of claim 14 wherein the step of providing a first stacked heat conducting structure comprises providing an interconnected arrangement of one or more metal trenches formed in respective ones of the plurality of layers and one or more metal vias passing through respective ones of the plurality of layers.

17. The method of claim 14 wherein the step of forming a lateral heat conducting structure further comprises forming the lateral heat conducting structure as a plurality of branches, the branches being coupled at respective ends thereof to respective ones of a plurality of stacked heat conducting structures.

18. The method of claim 14 wherein the step of forming a lateral heat conducting structure further comprises the step of forming the lateral heat conducting structure as a plurality of branches emanating from a central portion of the structure, the central portion being coupled to the first stacked heat conducting structure.

19. The integrated circuit of claim 1 wherein the lateral heat conducting structure is formed in an under bond metallization layer of the integrated circuit die, the under bond metallization layer being formed over the plurality of layers.

20. The integrated circuit of claim 1 wherein the lateral heat conducting structure is formed above a passivation layer of the integrated circuit die, the passivation layer comprising the uppermost layer of the plurality of layers.

21. The integrated circuit of claim 1 wherein only one lateral heat conducting structure is formed between the first stacked heat conducting structure and the second stacked heat conducting structure.

\* \* \* \* \*